(12) United States Patent
Otsuka et al.

(10) Patent No.: US 8,754,742 B2
(45) Date of Patent: Jun. 17, 2014

(54) MULTILAYER CERAMIC SUBSTRATE AND METHOD FOR PRODUCING THE SAME

(71) Applicant: Murata Manufacturing Co., Ltd., Nagaokakyo (JP)

(72) Inventors: Yusuke Otsuka, Nagaokakyo (JP); Yuichi Iida, Nagaokakyo (JP); Kazuo Kishida, Nagaokakyo (JP); Takahiro Takada, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/627,013

(22) Filed: Sep. 26, 2012

(65) Prior Publication Data

US 2013/0027175 A1     Jan. 31, 2013

Related U.S. Application Data

(63) Continuation of application No. PCT/JP2011/056915, filed on Mar. 23, 2011.

(30) Foreign Application Priority Data

Mar. 31, 2010   (JP) ................................ 2010-081622

(51) Int. Cl.
| | | |
|---|---|---|
| *H01C 1/012* | (2006.01) | |
| *H01C 17/30* | (2006.01) | |
| *H01C 7/00* | (2006.01) | |
| *H05K 3/46* | (2006.01) | |
| *H01L 23/13* | (2006.01) | |
| *H01C 17/075* | (2006.01) | |
| *H01L 23/538* | (2006.01) | |
| *H01L 23/66* | (2006.01) | |
| *H01C 1/14* | (2006.01) | |
| *H01C 17/00* | (2006.01) | |

(52) U.S. Cl.
CPC ................ *H01C 17/30* (2013.01); *H01C 7/003* (2013.01); *H05K 3/4629* (2013.01); *H01L 23/13* (2013.01); *H01C 17/075* (2013.01); *H01L 23/5385* (2013.01); *H01L 23/66* (2013.01); *H01C 1/14* (2013.01); *H01C 17/00* (2013.01)
USPC ........................................... 338/309; 338/307

(58) Field of Classification Search
CPC .......... H01C 7/003; H01C 1/14; H01C 17/00; H01C 17/28; H01C 17/30; H01C 17/075; H01L 23/13; H01L 23/5385; H01L 23/66; H05K 3/4629; H05K 1/183
USPC ........................................ 338/309, 307, 308
See application file for complete search history.

(56) References Cited

U.S. PATENT DOCUMENTS

| | | | | |
|---|---|---|---|---|
| 4,650,923 A | * | 3/1987 | Nishigaki et al. ............. | 174/257 |
| 5,396,397 A | * | 3/1995 | McClanahan et al. ........ | 361/313 |

(Continued)

FOREIGN PATENT DOCUMENTS

| | | |
|---|---|---|
| JP | 61-065464 A | 4/1986 |
| JP | 63-141301 A | 6/1988 |

(Continued)

OTHER PUBLICATIONS

Machine translation of JP 2008-277628, Nov. 12, 2008.*

(Continued)

*Primary Examiner* — Kyung Lee
(74) *Attorney, Agent, or Firm* — Keating & Bennett, LLP

(57) ABSTRACT

A multilayer ceramic substrate includes a ceramic laminated body including a plurality of ceramic layers stacked on each other, a resistor, and a resistor connecting conductor with a portion overlapping the resistor and an overcoat layer that covers the resistor located on a principal surface of the ceramic laminated body. An overcoat layer is made relatively thick during firing, thereby making cracks less likely to be caused, and after the firing step, the thickness of the overcoat layer is reduced by physically scraping down the surface of the overcoat layer, thereby reducing the trimming time. In the overcoat layer, a region that covers a portion in which a resistor overlaps a resistor connecting conductor is thicker than a region that covers the other portion.

12 Claims, 3 Drawing Sheets

(56) References Cited

U.S. PATENT DOCUMENTS

| | | | |
|---|---|---|---|
| 6,205,032 B1 * | 3/2001 | Shepherd | 361/793 |
| 6,455,453 B1 * | 9/2002 | Chikagawa | 501/120 |
| 6,797,093 B2 * | 9/2004 | Moriya et al. | 156/89.12 |
| 6,893,710 B2 * | 5/2005 | Lee et al. | 428/210 |
| 7,213,327 B2 * | 5/2007 | Su et al. | 29/610.1 |
| 7,417,196 B2 * | 8/2008 | Wada et al. | 174/260 |
| 8,491,834 B2 * | 7/2013 | Iida et al. | 264/614 |

FOREIGN PATENT DOCUMENTS

| | | |
|---|---|---|
| JP | 01-147897 A | 6/1989 |
| JP | 05-234726 A | 9/1993 |
| JP | 2001-168500 A | 6/2001 |
| JP | 2005-039164 A | 2/2005 |
| JP | 2008-277628 A | 11/2008 |

OTHER PUBLICATIONS

Machine translation of JP 2001-168500, Jun. 22, 2001.*
Official Communication issued in International Patent Application No. PCT/JP2011/056915, mailed on Apr. 26, 2011.
Official Communication issued in corresponding Japanese Patent Application No. 2012-508232, mailed on Jul. 3, 2013.

* cited by examiner

MULTILAYER CERAMIC SUBSTRATE AND METHOD FOR PRODUCING THE SAME

BACKGROUND OF THE INVENTION

1. Field of the Invention

The present invention relates to a multilayer ceramic substrate and a method for producing the same, and more particularly relates to a multilayer ceramic substrate which includes a resistor located on at least one principal surface, and further an overcoat layer located thereon, and a method for producing the same.

2. Description of the Related Art

When a resistor composed of a thick film is formed on a principal surface of a multilayer ceramic substrate, the resistor is overcoated with a glass-based material for the purposes of protecting this resistor and improving environmental resistance. In addition, the resistor is typically subjected to trimming after firing to adjust the resistance value.

For example, Japanese Patent Application Laid-Open No. 5-234726 discloses a method for forming a thick film resistor circuit, which includes the steps of: printing and burning a resistor onto a substrate; printing and burning a conductor in a predetermined position on the resistor; forming an overcoat layer on the resistor; and performing laser trimming to the resistor from the top of the overcoat layer to adjust a resistance value.

However, according to the technique described in Japanese Patent Application Laid-Open No. 5-234726, the substrate, the resistor, the conductor, and the overcoat layer are formed separately by firing or burning, there is thus a problem that the frequent firing or burning promotes sintering of the substrate, resistor, and conductor, thereby resulting in an excessively sintered state, and thus in characteristic degradation.

Therefore, techniques have been known for obtaining a substrate, a resistor, a conductor, and an overcoat layer by co-firing. For example, Japanese Patent Application Laid-Open No. 2005-39164 discloses a method for producing a glass ceramic wiring substrate, which includes the steps of: preparing an unfired ceramic green laminated body of a plurality of glass ceramic green sheets stacked on each other; forming a resistor, a conductor, and an overcoat layer on one principal surface of the ceramic green laminated body; then preparing an unfired composite laminated body by stacking a constraining green sheet along both principal surfaces of the ceramic green laminated body; firing the unfired composite laminated body; and then removing a constraining layer derived from the constraining green sheet.

However, it has been discovered that the following problem is caused in the case of forming the resistor and the overcoat layer by co-firing with the ceramic green laminated body, and then carrying out trimming for the resistor as in the technique described in Japanese Patent Application Laid-Open No. 2005-39164.

FIG. 6 is a cross-sectional view illustrating a portion of a multilayer ceramic substrate 51. FIG. 6 illustrates a ceramic laminated body 52 which is provided for the multilayer ceramic substrate 51, and a resistor 54, a resistor connecting conductor 55 with a portion overlapping with the resistor 54, and an overcoat layer 56 covering the resistor 54, which are each formed on a principal surface 53 of the ceramic laminated body 52.

To explain with reference to FIG. 6, there is a demand for the overcoat layer 56 to be formed as thinly as possible in order to shorten the trimming time after firing. However, when the overcoat layer 56 is formed thinly, the film thickness is likely to vary, and thus, it is difficult to form the overcoat layer 56 so as to have a uniform thickness.

In addition, when the overcoat layer 56 is formed thinly, cracks are likely to be caused in the overcoat layer 56 due to stress generated by factors such as differences in sintering behavior and coefficient of thermal expansion during firing between each of the ceramic laminated body 52, the resistor connecting conductor 55, and the resistor 54, and the overcoat layer 55. In particular, as in the case of portions 57 and 58 surrounded by dashed lines in FIG. 6, cracks are likely to be caused in portions in which the interface between dissimilar materials is present. The above-described cracks cause the problem of decreased reliability, such as variations in the resistance value of the resistor 54 through the ingress of a plating solution below the overcoat layer 56 in a plating step carried out subsequently.

SUMMARY OF THE INVENTION

Therefore, preferred embodiments of the present invention provide a method for producing a multilayer ceramic substrate, and the multilayer ceramic substrate, which make cracks much less likely to be caused in an overcoat layer, and moreover improve a trimming property, even when a resistor and the overcoat layer are formed by co-firing with a ceramic green laminated body.

According to a preferred embodiment of the present invention, a method for producing a multilayer ceramic substrate includes the steps of: preparing an unfired multilayer ceramic substrate including a ceramic green laminated body including a plurality of ceramic green layers stacked, and including a resistor, a resistor connecting conductor with a portion overlapping with the resistor, and an overcoat layer covering the resistor, each formed on at least one principal surface of the ceramic green laminated body; and firing the unfired multilayer ceramic substrate. The method further includes a step of reducing the thickness of the overcoat layer by physically scraping down a surface of the overcoat layer, such as, for example, applying a blasting treatment, after the firing step.

According to another preferred embodiment of the present invention, a multilayer ceramic substrate includes: a ceramic laminated body including a plurality of ceramic layers stacked on each other; and a resistor, a resistor connecting conductor including a portion overlapping with the resistor, and an overcoat layer covering the resistor, each located on at least one principal surface of the ceramic green laminated body, wherein a region in the overcoat layer that covers a portion in which the resistor overlaps with the resistor connecting conductor is thicker than a region that covers other portions. It is to be noted that the region that covers the other portions typically refers to a region in which a trimming groove is to be formed in the case of carrying out trimming.

The method for producing a multilayer ceramic substrate according to a preferred embodiment of the present invention includes the step of reducing the thickness of the overcoat layer by physically scraping off the surface of the overcoat layer after the firing step, thus makes it possible to make the overcoat layer thicker during firing, and on the other hand, make the layer thinner during trimming. Therefore, the method can make cracks much less likely to be caused in the overcoat layer, and moreover improve the trimming property, even when the resistor and the overcoat layer are formed by co-firing with the ceramic green laminated body.

On the other hand, in the case of the multilayer ceramic substrate according to a preferred embodiment of the present invention, the region in the overcoat layer that covers the portion in which the resistor overlaps with the resistor connecting conductor is made thicker than the region that covers other portions. Thus, while making the overcoat layer thinner in the latter region that covers the other portions, that is, the region to be subjected to trimming, to enhance the trimming property, the resistor can be made much less likely to be damaged due to, for example, thermal shock after firing, and even further at the stage of serving as a product. This is because stress is likely to be caused at the ends of the portion in which the resistor overlaps with the resistor connecting conductor, and thus, the resistor in this portion is likely to be damaged not only during firing but also after the firing, while, when the region in the overcoat layer that covers the portion in which the resistor overlaps with the resistor connecting conductor is made thicker as described above, the protection function of the overcoat layer for the resistor can be enhanced, and as a result, the resistor can be made so as to be much less likely to be damaged.

In the method for producing a multilayer ceramic substrate according to a preferred embodiment of the present invention, when the content of a glass component in an inorganic material component contained as a starting raw material in the overcoat layer is about 50 weight % or more with respect to the total of the inorganic material component, the overcoat layer is more likely to be scraped down, thereby making it easier to adjust the thickness of the overcoat layer. This is because the overcoat layer is more likely to be scraped down when the inorganic material contains a glass component that is greater than the ceramic material.

In addition, in the method for producing a multilayer ceramic substrate according to a preferred embodiment of the present invention, in the case of a multilayer ceramic substrate to be obtained including a surface exposure conductor exposed from the overcoat layer, and further including a step of plating the surface exposure conductor, the implementation of the previously described step of reducing the thickness of the overcoat layer after the step of plating makes it possible to further reduce the thickness of the overcoat layer, as compared with a case of implementation before the step of plating, because there is no need to be concerned about the plating solution resistance decreased due to the reduction in the thickness of the overcoat layer. This leads to an improvement in trimming property.

When the surface of the overcoat layer is subjected to a blasting treatment through a mask with an opening facing the region other than the region in the overcoat layer that covers the portion in which the resistor overlaps with the resistor connecting conductor in the step of reducing the thickness of the overcoat layer, or when the overcoat layer is formed in advance so that the region that covers the portion in which the resistor overlaps with the resistor connecting conductor is thicker as compared with the other region in the step of preparing the unfired multilayer ceramic substrate, it is easy for the region in the overcoat layer that covers the portion in which the resistor overlaps with the resistor connecting conductor to be made thicker than the region that covers the other portion.

When the method for producing a multilayer ceramic substrate according to a preferred embodiment of the present invention further includes a step of preparing a constraining green sheet containing an inorganic material powder which is not substantially sintered under a firing condition in the firing step, when the above-described step of preparing the unfired multilayer ceramic substrate includes a step of preparing an unfired composite laminated body with the constraining green sheet stacked along at least one principal surface including the principal surface of the ceramic green laminated body with the resistor formed thereon, when the above-described firing step is carried out for the unfired composite laminated body, and when the method further includes a step of removing a constraining layer derived from the constraining green sheet after the firing step, the step of scraping down the surface of the overcoat layer can be carried out with the use of the same equipment as in the step of removing the constraining layer. Accordingly, there is no need for new equipment or step for reducing the thickness of the overcoat layer.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
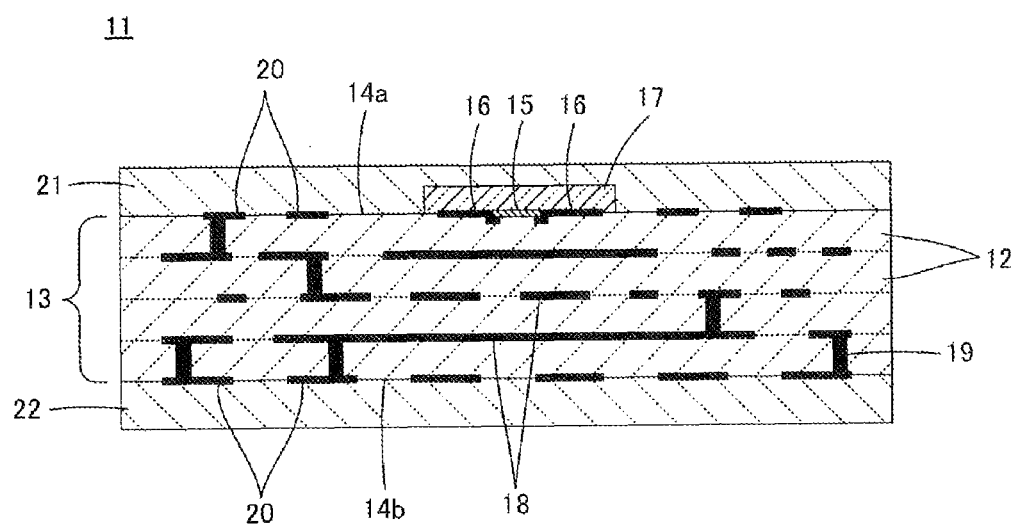
FIG. 1 is a cross-sectional view illustrating an unfired composite laminated body prepared in a method for producing a multilayer ceramic substrate according to a preferred embodiment of the present invention.

First, with reference to FIG. 3, the structure of a multilayer ceramic substrate 1 which is obtained by implementing a production method according to a preferred embodiment of the present invention will be described.

The multilayer ceramic substrate 1 includes a ceramic laminated body 3 including a plurality of ceramic layers 2 stacked on each other, a resistor 5 defined by a thick film, a resistor connecting conductor 6 including a portion overlapping with the resistor 5, and an overcoat layer 7 covering the resistor 5 which are each located on one principal surface 4a of the ceramic laminated body 3.

The ceramic laminated body 3 includes a variety of wiring conductors. The wiring conductors are intended to constitute passive elements such as, for example, capacitors and inductors, or provide connection wiring such as electrical connections between elements. The wiring conductors preferably include in-plane wiring conductors 8 and interlayer connecting conductors 9 which are provided in the ceramic laminated body 3. In addition, some of the wiring conductors are located on the outer surface of the ceramic laminated body 3. The resistor connecting conductor 6 described above, which is covered with the overcoat layer 7, is one of the wiring conductors located on the outer surface of the ceramic laminated body 3. In addition, the wiring conductors located on the outer surface of the ceramic laminated body 3 and exposed from the overcoat layer 7 include surface exposure conductors 10. The surface exposure conductors 10 are located on both one principal surface 4a and the other principal surface 4b of the ceramic laminated body 3.

Figure 3:
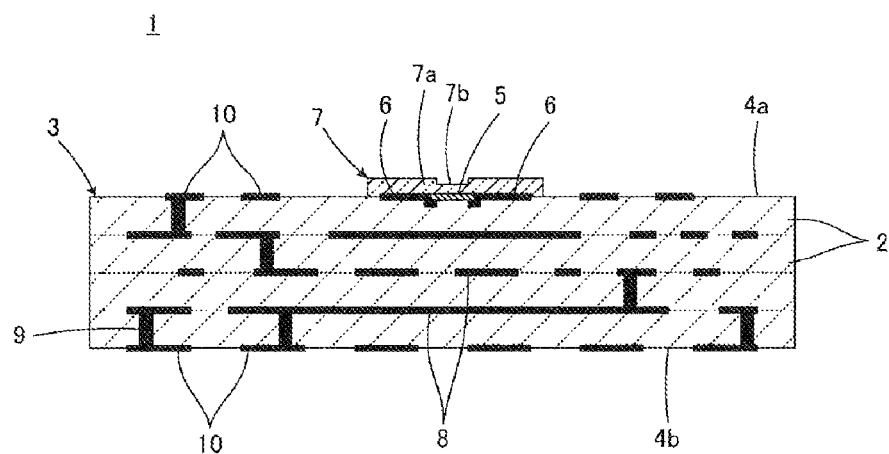
FIG. 3 is a cross-sectional view illustrating a multilayer ceramic substrate obtained after a step of reducing the thickness of an overcoat layer is applied to the multilayer ceramic substrate shown in FIG. 2.
Figure 4:
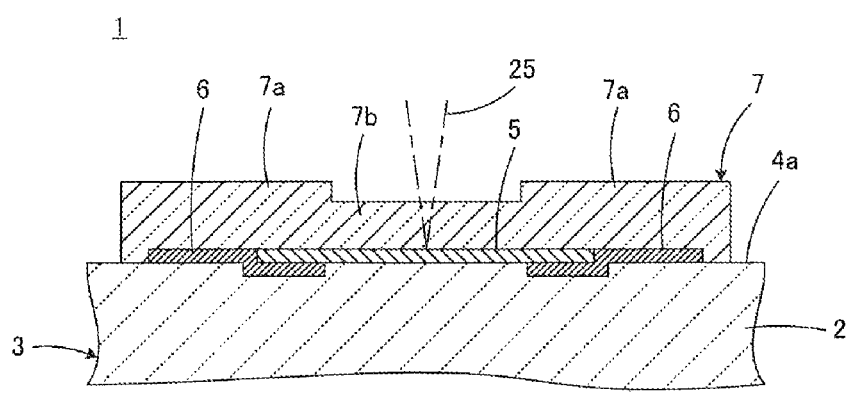
FIG. 4 is a cross-sectional view illustrating the enlarged overcoat layer as shown in FIG. 3.

As shown in FIGS. 3 and 4, it is preferable in the overcoat layer 7 that a region 7a that covers a portion in which the resistor 5 overlaps the resistor connecting conductor 6 be made thicker than a region 7b that covers the other portion, that is, typically a portion to be subjected to trimming. Thus, cracks due to thermal shock can be made much less likely to be caused in the overcoat layer 7 after firing, and even further at the stage of serving as a product, while the trimming property is enhanced.

A method for producing the multilayer ceramic substrate 1 described above will be described with reference to FIGS. 1 and 2. The multilayer ceramic substrate 1 shown in FIG. 3 is obtained through a step of firing an unfired composite laminated body 11 shown in FIG. 1.

The unfired composite laminated body 11 preferably includes: unfired ceramic layers 12 corresponding to the ceramic layers 2; an unfired ceramic green laminated body 13 corresponding to the ceramic laminated body 3; an unfired resistor 15 corresponding to the resistor 5; an unfired resistor connecting conductor 16 corresponding to the resistor connecting conductor 6; an unfired overcoat layer 17 corresponding to the overcoat layer 7; unfired in-plane wiring conductors 18 corresponding to the in-plane wiring conductors 8; unfired interlayer connecting conductors 19 corresponding to the interlayer connecting conductors 9; and unfired surface exposure conductors 20 corresponding to the surface exposure conductors 10.

The unfired composite laminated body 11 includes constraining green sheets 21 and 22 placed respectively on principal surfaces 14a and 14b of the unfired composite laminated body 11. The constraining green sheets 21 and 22 contain an inorganic material powder which is not substantially sintered under a firing condition in a firing step described later. It is to be noted that, of the constraining green sheets 21 and 22, the constraining green sheet 22 may be omitted which is placed on the principal surface 14b on which the resistor 15 is not formed.

In order to produce the unfired composite laminated body 11 shown in FIG. 1, the unfired ceramic green laminated body 13 is first prepared which is obtained by stacking the plurality of unfired ceramic layers 12. The ceramic green laminated body 13 includes the respectively unfired resistor connecting conductor 16, in-plane wiring conductors 18, interlayer connecting conductors 19, and surface exposure conductors 20.

Next, the unfired resistor 15 is formed on one principal surface 14a of the ceramic green laminated body 13 described above, and the unfired overcoat layer 16 is further formed thereon. The unfired resistor 15 is formed so as to partially overlap with the unfired resistor connecting conductor 16. It is to be noted that the unfired resistor connecting conductor 16 may be formed after the unfired resistor 15 is formed. Furthermore, the constraining green sheets 21 and 22 are placed so as to sandwich, in the stacking direction, the ceramic green laminated body 13 with the unfired resistor 15 and overcoat layer 17 formed. In this way, the unfired composite laminated body 11 is obtained.

In the step of preparing the unfired composite laminated body 11 described above, typically, prepared are ceramic green sheets to serve as the unfired ceramic layers 12; a resistor paste for forming the unfired resistor 15; an overcoat paste for forming the unfired overcoat layer 16; a conductive paste for forming the respectively unfired resistor connecting conductor 16, in-plane wiring conductors 18, interlayer connecting conductors 19, and surface exposure conductors 20; and the constraining green sheets 21 and 22.

Then, in order to form the unfired interlayer connecting conductors 19, through holes are provided in the specific ceramic green sheets, and filled with the conductive paste. In addition, in order to form each of the respectively unfired resistor connecting conductor 16, in-plane wiring conductors 18, and surface exposure conductors 20, the conductive paste is printed onto the specific ceramic green sheets. In addition, in order to form the unfired resistor 15, the resistor paste is printed onto the specific ceramic green sheets. Furthermore, in order to form the unfired overcoat layer 17, the overcoat paste is printed onto the specific ceramic green sheet.

Next, these ceramic green sheets are stacked in a predetermined order, thereby preparing the ceramic green laminated body 13 of the plurality of unfired ceramic layers 12 stacked. In addition, the constraining green sheets 21 and 22 are stacked so as to sandwich the ceramic green laminated body 13 in the stacking direction.

It is to be noted that for the formation of the unfired overcoat layer 17, a method may be adopted for stacking a green sheet including the same inorganic component as the overcoat paste. In this case, a green sheet with the same planar dimension as the ceramic green sheets to serve as the unfired ceramic layers 12 may be used as the overcoat green sheet.

Next, the unfired composite laminated body 11 is subjected to firing so as to achieve co-sintering of the ceramic green laminated body 13, unfired resistor 15, resistor connecting conductor 16, and overcoat layer 17, as well as the unfired in-plane wiring conductors 18, interlayer connecting conductors 19, and surface exposure conductors 20, which are obtained in the ways described above. In this firing step, the constraining green sheets 21 and 22 are not substantially sintered, and thus act to significantly reduce and prevent shrinkage in the direction of the principal surface of the ceramic green laminated body 13 and the like. As a result, the obtained multilayer ceramic substrate 1 has an increased dimensional accuracy.

Figure 2:
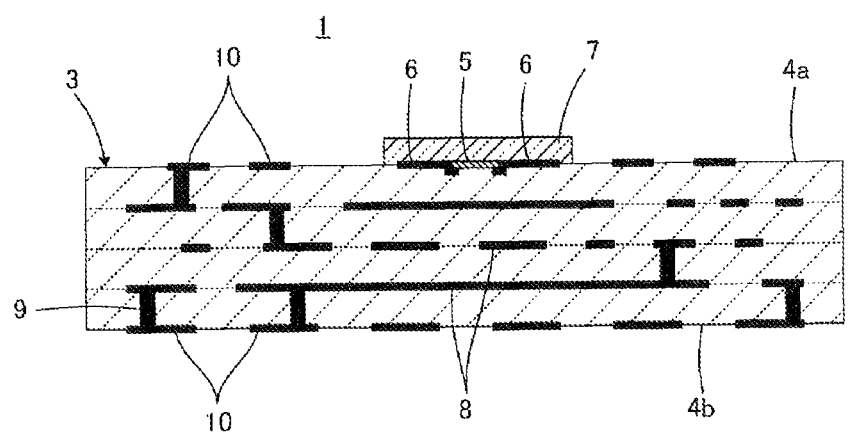
FIG. 2 is a cross-sectional view illustrating a multilayer ceramic substrate obtained after firing the composite laminated body shown in FIG. 1, and then removing a constraining layer.

The multilayer ceramic substrate 1 in the state shown in FIG. 2 is extracted by removing the constraining layers derived from the constraining green sheets 21 and 22 after the firing step described above. When the firing step is completed, the constraining layers are porous, and can be thus removed easily.

Next, if necessary, a step of plating the surface exposure conductors 10 is carried out. After this plating step, a step of reducing the thickness of the overcoat layer 7 is carried out as described later. When the step of reducing the thickness of the overcoat layer 7 is carried out after the plating step as just described, the ingress of a plating solution can be prevented with more certainty because the overcoat layer 7 is relatively thick before the reduction of the thickness in carrying out the plating step, and in the step of reducing the thickness of the overcoat layer 7, it becomes possible to further reduce the thickness of the overcoat layer 7 because there is no need to be concerned about plating solution resistance decreased due to the reduced thickness of the overcoat layer 7.

Next, the step of reducing the thickness of the overcoat layer 7 is carried out. This step is intended to increase the efficiency of a trimming step which can be carried out subsequently. Specifically, a process such as wet blasting, sandblasting, chemical blasting, or polishing is carried out in such a way that the surface of the overcoat layer is physically scraped down.

It is to be noted that while the plating step is preferably performed between the constraining layer removal step and the step of reducing the thickness of the overcoat layer in the above description, the step of reducing the thickness of the overcoat layer may be carried out subsequently after the constraining layer removal step. The latter case has the advantage that the surface of the overcoat layer can be scraped down continuously with the use of the same equipment as in the constraining layer removal step.

As described previously, in the overcoat layer 7, the region 7a that covers the portion in which the resistor 5 overlaps the resistor connecting conductor 6 is made thicker than the region 7b that covers the other portion, that is, typically the portion to be subjected to trimming.

On the other hand, the overcoat layer 7 is more likely to be scraped down when the overcoat layer 7 includes an inorganic material component as a starting raw material, the inorganic material component includes a glass component, and the content of the glass component preferably is about 50 weight % or more with respect to the total of the inorganic material component, for example. Therefore, the step of reducing the thickness of the overcoat layer 7 can be carried forward efficiently.

Next, if necessary, the step of trimming the resistor 5 is carried out. For the trimming, the resistor 5 is irradiated with laser light 25 through the overcoat layer 7 as indicated by an imaginary line in FIG. 4. In this case, the trimming can be carried forward efficiently, because the relatively thin region 7b in the overcoat layer 7 is irradiated with the laser light 25.

Figure 5:
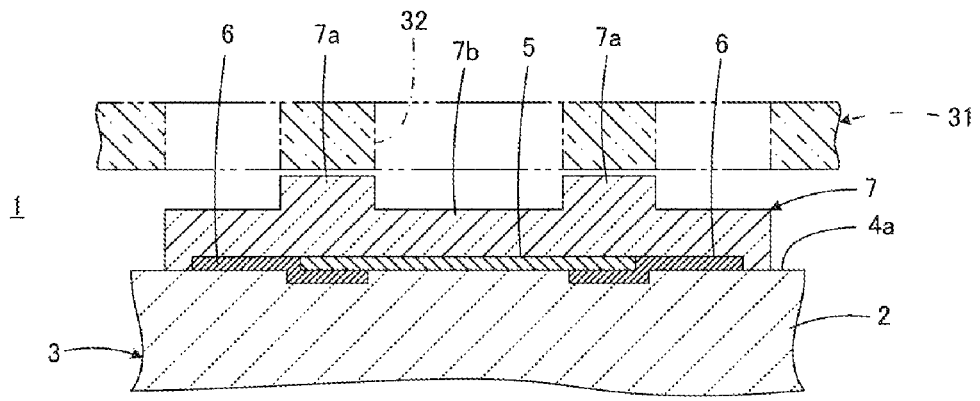
FIG. 5 is a diagram corresponding to FIG. 4 for explaining another preferred embodiment of the present invention.
Figure 6:
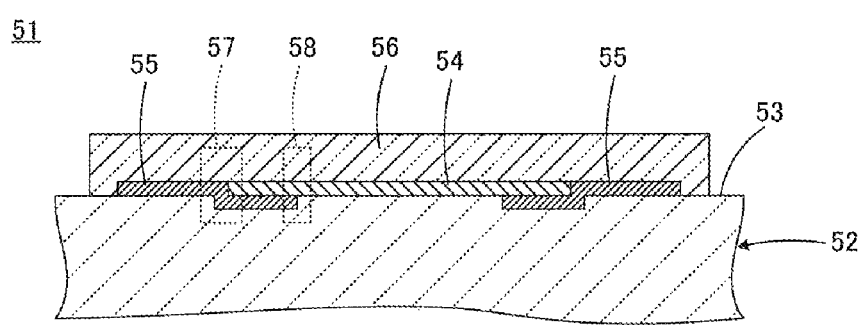
FIG. 6 is a cross-sectional view illustrating an enlarged portion with an overcoat layer formed in a conventional multilayer ceramic substrate.

In the overcoat layer 7, the region 7a that covers the portion in which the resistor 5 overlaps the resistor connecting conductor 6 may be made thicker than the region 7b that covers the other portion as shown in FIG. 5. In FIG. 5, a more limited region 7a that covers a portion in which the resistor 5 overlaps the resistor connecting conductor 6 is made thicker than the region 7b that covers the other portion.

The overcoat layer 7 in this form can be easily formed by, for example, applying a blasting treatment to the surface of the overcoat layer 7 through a mask 31 with an opening 32 facing the region 7b in the overcoat layer 7 other than the region 7a that covers the portion in which the resistor 5 overlaps the resistor connecting conductor 6, as indicated by an imaginary line in FIG. 5.

Alternatively, when a region that covers a portion in which the unfired resistor 15 overlaps the resistor connecting conductor 16 is formed in advance to be thicker as compared with the other region for the formation of the unfired overcoat layer 17 in the step of preparing the unfired composite laminated body 11, while the thickness is reduced over the entire overcoat layer 7 after firing, the region 7a in the overcoat layer 7 that covers the portion in which the resistor 5 overlaps the resistor connecting conductor 6 can be easily made thicker than the region 7b that covers the other region.

In the preferred embodiment described above, when printing of the overcoat paste is applied for the formation of the unfired overcoat layer 17, the region that covers the portion in which the unfired resistor 15 overlaps the resistor connecting conductor 16 can be formed to be thicker by increasing the frequency of the printing.

It is to be noted that even in the case of obtaining the overcoat layer 7 in the form shown in FIG. 4, the mask 31 may be used as described above, or the region 7a may be formed in advance to be thicker.

Non-limiting experimental examples will be described below, which were carried out in accordance with various preferred embodiments of the present invention.

EXPERIMENTAL EXAMPLE 1

A $SiO_2$—CaO-$B_2O_3$—$Al_2O_3$-based crystallized glass powder was prepared as a glass material, and an alumina powder was prepared as a ceramic material.

First, the glass powder, the alumina powder, and further an acrylic binder and a dispersant were weighed for 55:45:10:2 in ratio by weight, and with the addition of a solvent thereto, mixed in a ball mill to prepare slurry, and then, this slurry was formed into the shape of a sheet by a doctor blade method, thereby providing ceramic green sheets of 200 μm in thickness.

These ceramic green sheets were intended to form ceramic layers provided for a ceramic laminated body, and in-plane wiring conductors were appropriately formed by screen printing onto the ceramic green sheets with the use of a silver paste, whereas resistor connecting conductors and surface exposure conductors were formed by screen printing onto the ceramic green sheets to serve as surface layers, likewise with the use of the silver paste.

Next, prepared was a resistor paste containing $RuO_2$: 30 parts by weight, $SiO_2$—CaO—$Al_2O_3$—$B_2O_3$—$K_2O$-based glass: 70 parts by weight, Ag: 5 parts by weight, a resin: 6 parts by weight, a dispersant: 1 part by weight, and a solvent: 50 parts by weight, and this resistor paste was applied by screen printing onto the ceramic green sheets to serve as surface layers, thereby forming a resistor partially overlapping with the resistor connecting conductor.

Next, prepared was an overcoat paste containing an inorganic material component of the foregoing glass powder and alumina powder blended at the ratio by weight shown in "Glass/Alumina Ratio by Weight of Overcoat Material" of Table 1: 100 parts by weight, a resin: 6 parts by weight, a dispersant: 1 part by weight, and a solvent: 50 parts by weight, and the overcoat paste was applied by screen printing so as to cover the entire resistor, thereby forming an overcoat layer. The overcoat layer herein was adapted to have the thickness shown in the column of "Overcoat Thickness after Firing" in Table 1 after firing. It is to be noted that the "Overcoat Thickness after Firing" shown in Table 1 refers to the thickness in the region that covers a portion of the resistor which has no overlap with the resistor connecting conductor.

Next, the alumina powder mentioned above, a dispersant, and a butyral-based binder were weighed for 100:2:8 in ratio by weight, and with the addition of a solvent thereto, mixed in a ball mill to prepare slurry, and this slurry was formed into the shape of a sheet by a doctor blade method to obtain constraining green sheets of 200 μm in thickness.

Next, five of the ceramic green sheets described previously were stacked, with the constraining green sheets described previously stacked so as to sandwich the ceramic green sheets in the stacking direction, and then subjected to pressure bonding to obtain an unfired composite laminated body.

Next, the composite laminated body was subjected to firing at a top temperature of 900° C. This firing condition is a conduction under which the constraining green sheets are not sintered, whereas the ceramic green sheets, the overcoat layer, the resistor, and the conductors can be sintered adequately.

Next, the fired composite laminated body was subjected to a wet blasting treatment to remove the constraining layers derived from the constraining green sheets at the surfaces, thereby extracting sintered multilayer ceramic substrates according to each sample.

Next, the multilayer ceramic substrates according to each sample were subjected to a step of applying a plating process to the surface exposure conductors and a (thickness reduction) step of reducing the thickness of the overcoat layer by wet blasting. However, the latter thickness reduction step was carried out only for specific samples, as shown in Table 1. Then, as shown in the column "Timing of Thickness Reduction" of Table 1, the samples for which the thickness reduction step was carried out include some samples for which this step was carried out "before the plating" and the others for which the step was carried out "after the plating", and in each case, the step was carried out for the period of time shown in the "Thickness Reduction Time" in Table 1 until the overcoat layer reached the thickness shown in the "Overcoat Thickness after Thickness Reduction" of Table 1.

For the multilayer ceramic substrates according to each sample obtained in the way described above, the resistor was subjected to laser trimming to make adjustment of the resistance value, and the trimming rate was figured out as shown in the column "Trimming Rate" of Table 1.

In addition, for the multilayer ceramic substrate according to each sample, the presence or absence of cracks caused in the overcoat layer and the plating solution resistance were evaluated as respectively shown in the columns "Crack" and "Plating Resistance" of Table 1.

As for the "Crack", after the section to be evaluated was subjected to dicing and fixed with a curable resin, the cross section of the sample was polished, and this cross section was observed by SEM to evaluate the presence or absence of cracks caused. The evaluation was performed at four points for each sample.

As for the "Plating Resistance", the resistance value of the resistor covered by the overcoat layer was compared between before and after the plating process, and it was determined that the plating solution resistance was favorable if changes in resistance value fell below ±0.5% for all of the resistors, whereas it was determined that the plating solution resistance was inferior if there were one or more of the resistors for which changes in resistance value exceeded±0.5%. It is to be noted that the number of pieces evaluated was 135 for each sample. In the "Plating Resistance" of Table 1, the symbol "G" indicates that the plating solution resistance was favorable, whereas the symbol "NG" indicates that the plating solution resistance was inferior.

TABLE 1

| Sample Number | Glass/Alumina Ratio by Weight of Overcoat Material | Overcoat Thickness after Firing (μm) | Overcoat Thickness after Thickness Reduction (μm) | Thickness Reduction Time (min) | Thickness Reduction Timing | Crack | Plating Resistance | Trimming Rate (mm/second) |
|---|---|---|---|---|---|---|---|---|
| *1 | 100/0 | 10 | — | — | — | Yes | NG | 65 |
| *2 |  | 12 | — | — | — | Yes | G | 50 |
| *3 |  | 14 | — | — | — | No | G | 35 |
| 4 |  | 14 | 12 | 0.5 | Before Plating | No | G | 50 |
| 5 |  | 14 | 10 | 1.5 | After Plating | No | G | 65 |
| *6 | 70/30 | 8 | — | — | — | Yes | NG | 58 |
| *7 |  | 9 | — | — | — | Yes | G | 50 |
| *8 |  | 11 | — | — | — | No | G | 35 |
| 9 |  | 11 | 9 | 1 | Before Plating | No | G | 50 |
| 10 |  | 11 | 8 | 2 | After Plating | No | G | 58 |
| *11 | 50/50 | 5 | — | — | — | Yes | NG | 66 |
| *12 |  | 6 | — | — | — | Yes | G | 58 |
| *13 |  | 8 | — | — | — | No | G | 35 |
| 14 |  | 8 | 6 | 2 | Before Plating | No | G | 58 |
| 15 |  | 8 | 5 | 3 | After Plating | No | G | 66 |
| *16 | 40/60 | 6 | — | — | — | Yes | NG | 50 |
| *17 |  | 7 | — | — | — | Yes | G | 40 |
| *18 |  | 9 | — | — | — | No | G | 20 |
| 19 |  | 9 | 7 | 4 | Before Plating | No | G | 40 |
| 20 |  | 9 | 6 | 8 | After Plating | No | G | 50 |

In Table 1, the samples of sample numbers assigned with * are comparative examples outside the scope of the present invention.

When respective comparisons are made among samples 1 to 3, among samples 6 to 8, among samples 11 to 13, as well as among samples 16 to 18 as comparative examples outside the scope of the present invention, the samples which are relatively small in "Overcoat Thickness after Firing" have cracks caused, and are inferior in terms of plating solution resistance. In addition, when respective comparisons are made likewise among samples 1 to 3, among samples 6 to 8, among samples 11 to 13, as well as among samples 16 to 18, the thicker "Overcoat Thickness after Firing" leads to a decrease in trimming rate.

In contrast to these samples, samples 4 and 5 within the scope of the present invention have no cracks caused, have favorable plating solution resistance, and are almost equivalent in trimming rate, although samples 4 and 5 are equal in "Overcoat Thickness after Thickness Reduction" respectively to samples 2 and 1 described above which have cracks caused. The same is equally true of a comparison between samples 9 and 10 and samples 7 and 6, a comparison between samples 14 and 15 and samples 12 and 11, as well as a comparison between samples 19 and 20 and samples 17 and 16.

From the foregoing, it is determined that samples 4, 5, 9, 10, 14, 15, 19, and 20 within the scope of the present invention can ensure very favorable trimming properties while preventing the overcoat layer from being cracked during firing, because the "Overcoat Thickness after Thickness Reduction" was reduced relatively while increasing the "Overcoat Thickness after Firing".

In addition, when the case of the "Thickness Reduction Timing" "Before Plating" is compared with the case of the "Thickness Reduction Timing" "After Plating", the following is found.

In the case of giving samples 1 to 5 as examples, the plating solution resistance is defective when the thickness of the overcoat layer for plating, that is, the "Overcoat Thickness after Firing" is 10 μm as in the case of sample 1, whereas the plating solution resistance is favorable when the "Overcoat Thickness after Firing" is 12 μm or more as in the case of samples 2 and 3. More specifically, under the conditions for samples 1 to 5, the thickness of the overcoat layer has to be 12 μm or more for plating in order to ensure favorable plating solution resistance. Therefore, in the case of sample 4 with the "Thickness Reduction Timing" "Before Plating", the thickness of the overcoat layer can be reduced only until the "Overcoat Thickness after Thickness Reduction" reaches 12 μm in order to ensure favorable plating solution resistance. In contrast, in the case of sample 5 with the "Thickness Reduction Timing" "After Plating", the thickness of the overcoat layer can be thus reduced until the "Overcoat Thickness after Thickness Reduction" reaches about 10 μm or less, for example, which is less than 12 μm.

The same is equally true of the case of samples 6 to 10, the case of samples 11 to 15, as well as the case of samples 16 to 20.

In addition, when a comparison is made among samples 4 and 5, samples 9 and 10, samples 14 and 15, and samples 19 and 20, within the scope of the present invention, it is determined that the higher "Glass/Alumina Ratio by Weight of Overcoat Material", that is, the higher content rate of glass makes the overcoat layer more likely to be scraped down, and thus, the "Thickness Reduction Time" can be reduced. Conversely, it is assumed to be because more alumina contained results in more deposition of high-hardness anorthite crystals that the higher content rate of alumina makes the "Thickness Reduction Time" longer.

On the other hand, there is a tendency that the lower "Glass/Alumina Ratio by Weight of Overcoat Material", that is, the higher content rate of alumina results in more favorable plating solution resistance. For example, when a comparison is made between samples 6 and 13, the content rate of alumina is higher in this order, such as the "Glass/Alumina Ratio by Weight of Overcoat Material" of "70/30" in the case of sample 6 and "50/50" in the case of sample 13, while the "Overcoat Thickness after Firing" is "8 μm" in each case of these samples 6 and 13. Then, when attention is paid to plating solution resistance, sample 6 with the lower content rate of alumina is considered defective, whereas sample 13 with the higher content rate of alumina is considered favorable. Furthermore, in view of sample 17, sample 17 has the "Overcoat Thickness after Firing" of "7 μm", which is less than in the case of sample 6, but the higher "Glass/Alumina Ratio by Weight of Overcoat Material" of "40/60". Furthermore, when attention is paid to the plating solution resistance, sample 17 is considered favorable in spite of the smallest "Overcoat Thickness after Firing". These tendencies are assumed to be due to the fact that ceramic is superior to glass in plating solution resistance, and the fact that the higher rate of alumina makes a crystalline phase likely to be deposited.

In addition, although Table 1 has no data obtained when the "Glass/Alumina Ratio by Weight of Overcoat Material" is "55/45", there is a tendency that the "Glass/Alumina Ratio by Weight of Overcoat Material" closer to "55/45" makes cracks less likely to be caused even in the case of the small "Overcoat Thickness after Firing". For example, when a comparison is made between sample 6 and sample 13, sample 6 has cracks caused with the "Glass/Alumina Ratio by Weight of Overcoat Material" further from "55/45", whereas sample 13 has no cracks caused with the "Glass/Alumina Ratio by Weight of Overcoat Material" of "50/50" which is closer to "55/45", while the "Overcoat Thickness after Firing" is "8 μm" in each case of these samples 6 and 13. This is assumed to be because the shrinkage behavior is more likely to be matched due to the fact that the overcoat material and the material of the ceramic layers are closer to each other when the "Glass/Alumina Ratio by Weight of Overcoat Material" is closer to "55/45".

EXPERIMENTAL EXAMPLE 2

In Experimental Example 2, the effect was investigated when a region in an overcoat layer that covers a portion in which a resistor had an overlap with a resistor connecting conductor was made thicker than a region covering the other portion.

First, a fired composite laminated body as a sample was obtained through the same operation as in the case of Experimental Example 1. However, in Experimental Example 2, the "Glass/Alumina Ratio by Weight of Overcoat Material" was adjusted to "100/0", and the "Overcoat Thickness after Firing" was adjusted to "14 μm".

Next, the fired composite laminated body was subjected to a wet blasting treatment to remove the constraining layers derived from the constraining green sheets at the surfaces, thereby extracting sintered multilayer ceramic substrates according to each sample. Then, the multilayer ceramic substrates according to each sample were subjected to a plating process for surface exposure conductors, and subsequently, subjected to a wet blasting treatment, and to a step of reducing the thickness of the overcoat layer. In the step of reducing the thickness of the overcoat layer, the thickness was reduced uniformly over the entire overcoat layer in the case of sample 21, whereas the thickness was reduced, in the middle of the step, through a mask with an opening facing the region other than the region that covers the portion in which the resistor had an overlap with the resistor connecting conductor in the case of sample 22. Then, after the step of reducing the thickness, the minimum thickness was figured out for the region in the overcoat layer that covers the portion in which the resistor had an overlap with the resistor connecting conductor, and the average thickness was figured out for the other region. In Table 2, the former and the latter are shown respectively in the column "Minimum Thickness of Overcoat on Resistor+Conductor" and the column "Average Thickness of Overcoat on Resistor".

Next, in the same manners as in the case of Experimental Example 1, for the multilayer ceramic substrates according to each sample, the resistor was subjected to laser trimming to make adjustment of the resistance value, and the trimming rate was figured out as shown in the column "Trimming Rate" of Table 2, and as shown in the column "Crack" of Table 2, the presence or absence of cracks caused in the overcoat layer was evaluated. In addition, the plating solution resistance was evaluated as shown in the column "Plating Resistance" of Table 2.

Furthermore, for the multilayer ceramic substrates according to each sample, a "heat cycle test" was carried out for applying 2000 cycles of heat cycle from −40° C. to 250° C. Then, for 135 pieces evaluated, a determination was made as a defective when there were one or more resistors varying in resistance value by ±0.5% or more as compared with the resistance value before the "Heat Cycle Test". In the "Heat Cycle Test" of Table 1, the symbol "G" indicates that no determination was made as a defective, whereas the symbol "NG" indicates that a determination was made as a defective.

TABLE 2

| Sample Number | Overcoat Thickness after Firing (before Thickness Reduction) (μm) | Minimum Thickness of Overcoat on Resistor + Conductor (μm) | Average Thickness of Overcoat on Resistor (μm) | Crack | Plating Resistance | Trimming Rate (mm/second) | Heat Cycle Test |
|---|---|---|---|---|---|---|---|
| 21 | 14 | 10 | 10 | No | G | 65 | NG |
| 22 | 14 | 12 | 10 | No | G | 65 | G |

It is to be noted that sample 21 shown in Table 2 corresponds to sample 5 shown in Table 1 as can be seen from the description above.

In comparison with sample 21, sample 22 has the same "Average Thickness of Overcoat on Resistor", and shows similar results in each respect of "Crack", "Plating Resistance", and "Trimming Rate". However, when a comparison is made in terms of "Heat Cycle Test", sample 21 results in "NG", whereas sample 22 results in "G".

As can be seen from the foregoing, when the "Minimum Thickness of Overcoat on Resistor+Conductor" is increased as compared with the "Average Thickness of Overcoat on Resistor" as in the case of sample 22, the thermal shock resistance can be increased while maintaining a favorable trimming property.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for producing a multilayer ceramic substrate, the method comprising the steps of:
preparing an unfired multilayer ceramic substrate including a ceramic green laminated body including a plurality of ceramic green layers stacked on each other, the multilayer ceramic substrate also including a resistor, a resistor connecting conductor including a portion that overlaps the resistor, and an overcoat layer covering the resistor each located on at least one principal surface of the ceramic green laminated body;
firing the unfired multilayer ceramic substrate; and
reducing a thickness of the overcoat layer by physically scraping down a surface of the overcoat layer after the firing step; wherein
in the step of reducing the thickness of the overcoat layer, a region of the overcoat layer that covers a portion in which the resistor overlaps the resistor connecting conductor is formed to be thicker than a region that covers other portions.

2. The method for producing a multilayer ceramic substrate according to claim 1, wherein the overcoat layer contains an inorganic material component as a starting raw material, the inorganic material component contains a glass component, and a content of the glass component is about 50 weight % or more with respect to a total amount of the inorganic material component.

3. The method for producing a multilayer ceramic substrate according to claim 1, wherein the unfired multilayer ceramic substrate includes a surface exposure conductor exposed from the overcoat layer, and the method further comprises a step of plating the surface exposure conductor, and the step of reducing the thickness of the overcoat layer is carried out after the step of plating.

4. The method for producing a multilayer ceramic substrate according to claim 1, wherein the step of reducing the thickness of the overcoat layer includes a step of applying a blasting treatment to a surface of the overcoat layer through a mask with an opening facing a region other than a region in the overcoat layer that covers the portion in which the resistor overlaps the resistor connecting conductor.

5. The method for producing a multilayer ceramic substrate according to claim 1, wherein the overcoat layer is formed in advance so that the region that covers the portion in which the resistor overlaps the resistor connecting conductor is thicker than another region in the step of preparing the unfired multilayer ceramic substrate.

6. The method for producing a multilayer ceramic substrate according to claim 1, further comprising a step of preparing a constraining green sheet containing an inorganic material powder which is not substantially sintered under a firing condition in the firing step; wherein
the step of preparing the unfired multilayer ceramic substrate includes a step of preparing the unfired composite laminated body so as to include the constraining green sheet stacked along the at least one principal surface of the ceramic green laminated body with the resistor formed thereon; and
the method further comprises a step of removing a constraining layer derived from the constraining green sheet after the firing step.

7. The method for producing a multilayer ceramic substrate according to claim 6, wherein the unfired multilayer ceramic substrate includes a surface exposure conductor exposed from the overcoat layer, and the step of reducing the thickness of the overcoat layer is performed after the step of removing the constraining layer and after a step of plating the surface exposure conductor.

8. The method for producing a multilayer ceramic substrate according to claim 6, wherein the unfired multilayer ceramic substrate includes a surface exposure conductor exposed from the overcoat layer, and the step of reducing the thickness of the overcoat layer is performed after the step of removing the constraining layer and before a step of plating the surface exposure conductor.

9. The method for producing a multilayer ceramic substrate according to claim 1, wherein the step of forming the unfired multilayer ceramic substrate includes forming a plurality of wiring conductors to define at least one of a capacitor, an inductor and an interlayer connecting conductor.

10. The method for producing a multilayer ceramic substrate according to claim 1, further comprising the step of trimming the resistor after the step of reducing the thickness of the overcoat layer.

11. The method for producing a multilayer ceramic substrate according to claim 10, wherein the step of trimming includes irradiating the resistor through the overcoat layer using a laser light.

12. The method for producing a multilayer ceramic substrate according to claim 1, wherein the step of reducing the thickness of the overcoat layer includes at least one of wet blasting, sandblasting, chemical blasting and polishing the overcoat layer.

* * * * *